United States Patent
Mardilovich et al.

(10) Patent No.: US 7,381,631 B2
(45) Date of Patent: Jun. 3, 2008

(54) USE OF EXPANDING MATERIAL OXIDES FOR NANO-FABRICATION

(75) Inventors: Peter Mardilovich, Corvallis, OR (US); Pavel Kornilovich, Corvallis, OR (US); Randy Hoffman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 400 days.

(21) Appl. No.: 11/174,798

(22) Filed: Jul. 5, 2005

(65) Prior Publication Data
US 2007/0010101 A1 Jan. 11, 2007

(51) Int. Cl.
*H01L 21/20* (2006.01)
*H01L 21/36* (2006.01)

(52) U.S. Cl. ............ 438/479; 438/478; 438/165; 438/225; 438/425; 257/E21.079; 257/E21.082; 257/E21.282; 977/700

(58) Field of Classification Search .......... 438/479, 438/431
See application file for complete search history.

(56) References Cited

U.S. PATENT DOCUMENTS

| 5,126,283 | A | | 6/1992 | Pintchovski et al. |
|---|---|---|---|---|
| 6,069,070 | A | * | 5/2000 | Labunov et al. ........... 438/635 |
| 6,319,727 | B1 | | 11/2001 | Vlassak |
| 2003/0140678 | A1 | * | 7/2003 | Siegel et al. ................ 72/456 |
| 2003/0217804 | A1 | * | 11/2003 | Guo et al. .................. 156/230 |
| 2005/0017261 | A1 | * | 1/2005 | Ishizaki ..................... 257/103 |
| 2005/0072967 | A1 | | 4/2005 | Kornilovich et al. |

FOREIGN PATENT DOCUMENTS

EP 0111774 6/1984

OTHER PUBLICATIONS

Uematsu et al., Two-dimensional simulation of pattern-dependent oxidation of silicon nanostructures on silicon-on-insulator substrates, Solid State Electronics, Jun. 6, 2004.
Transmittal of the International Search Report and the Written Opinion of the International Searching Authority dated Nov. 12, 2006.

* cited by examiner

*Primary Examiner*—Walter Lindsay, Jr.
*Assistant Examiner*—Abdulfattah Mustapha

(57) ABSTRACT

This invention relates to a method of fabricating nano-dimensional structures, comprising: depositing at least one deformable material upon a substrate such that the material includes at least one portion; and creating an oxidizable layer located substantially adjacent to the deposited deformable material such that at least a portion of the oxidized portion of the oxidizable layer interacts with the at least one portion of the deformable material to apply a localized pressure upon the at least one portion of the deformable material.

14 Claims, 12 Drawing Sheets

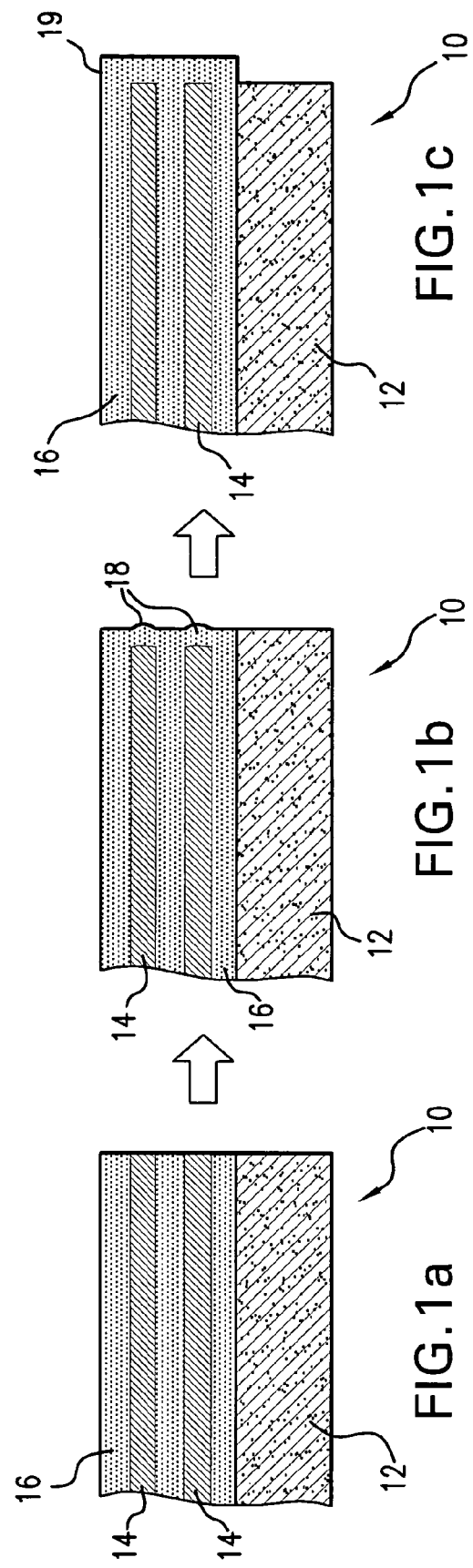

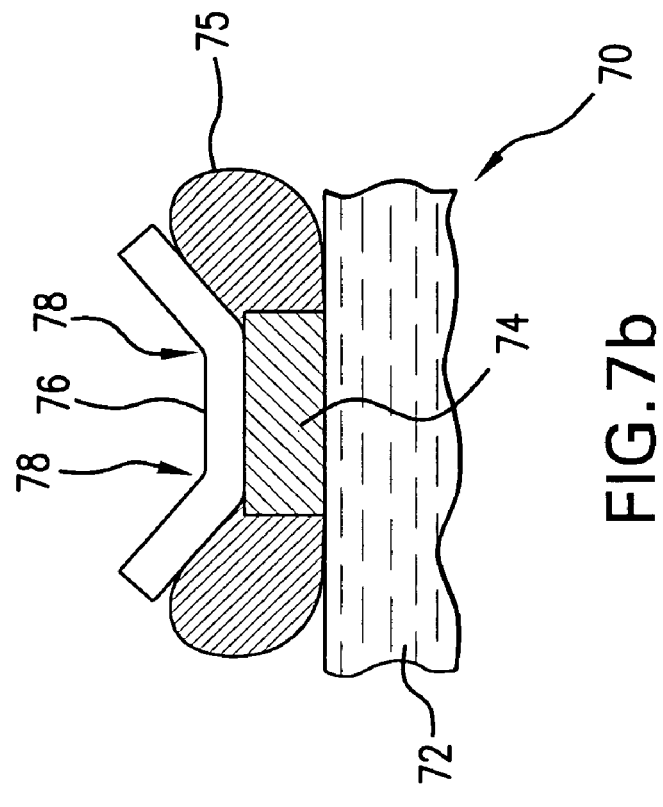
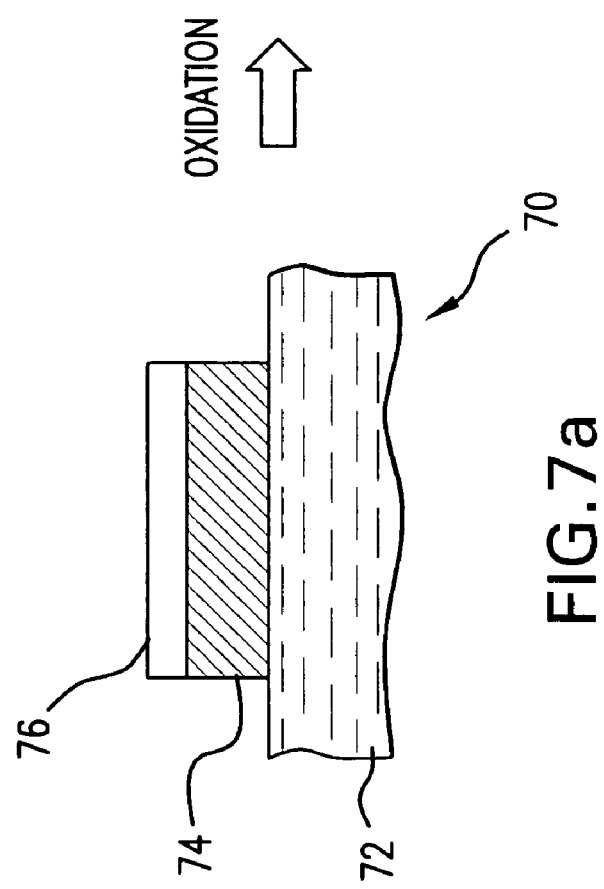

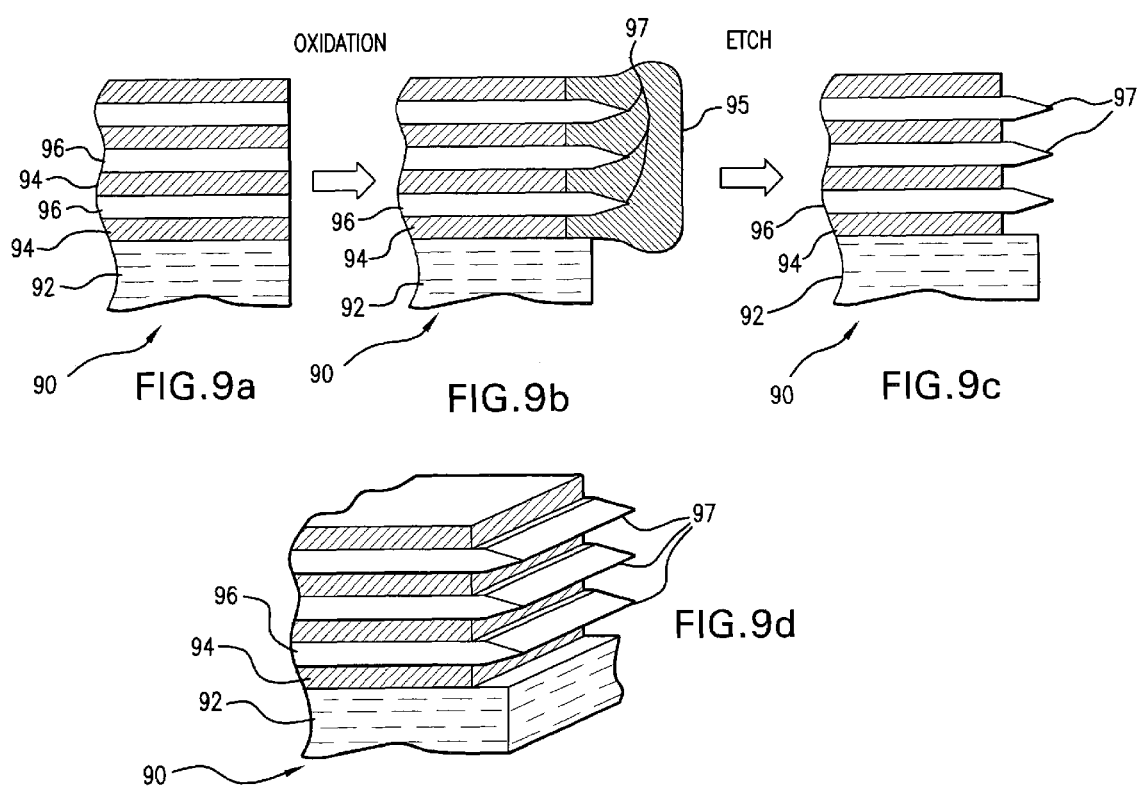

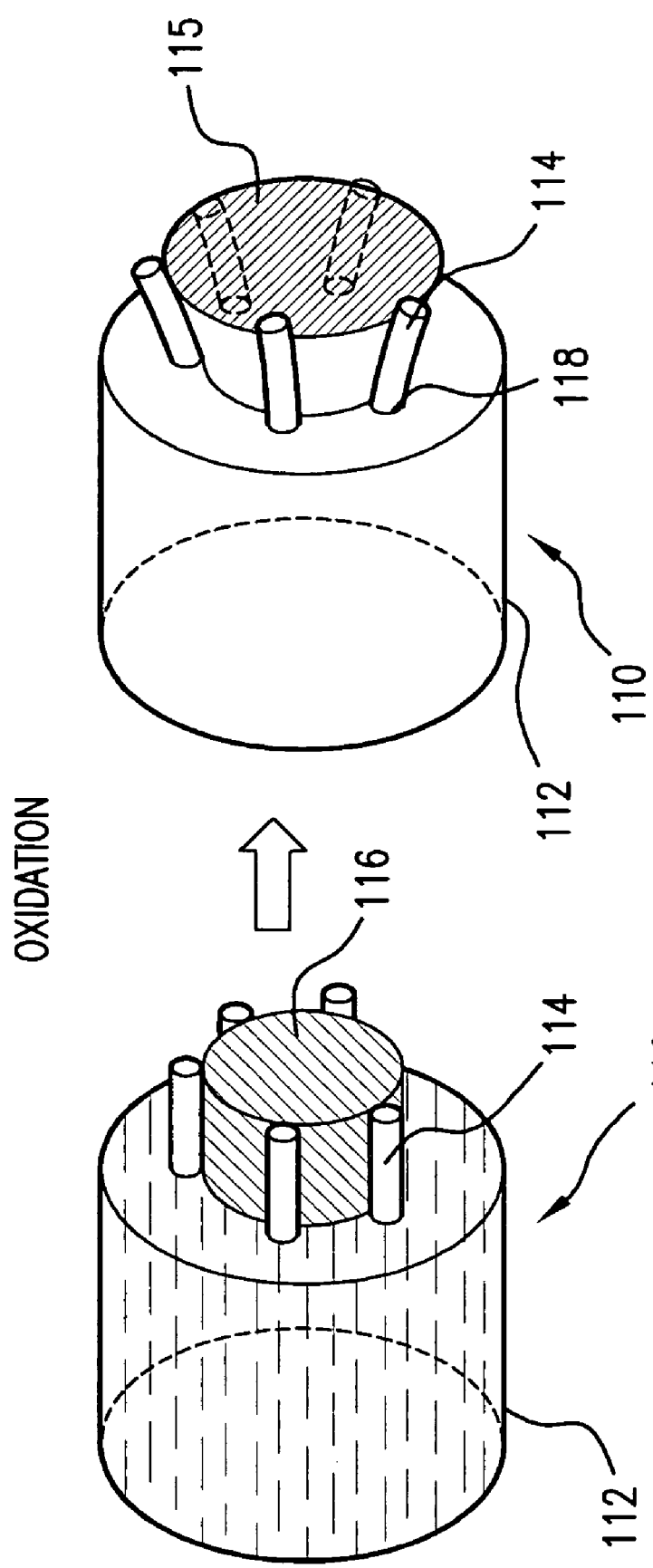

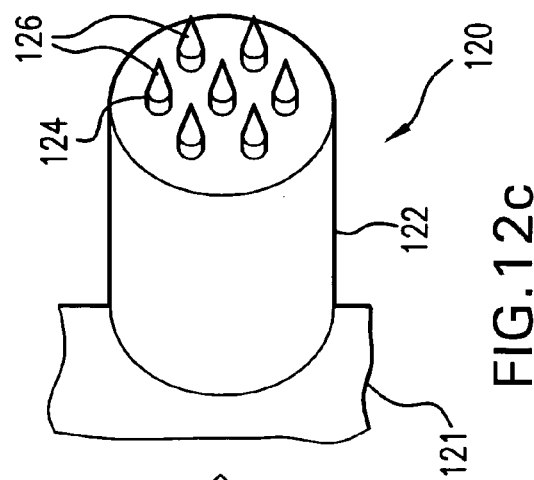
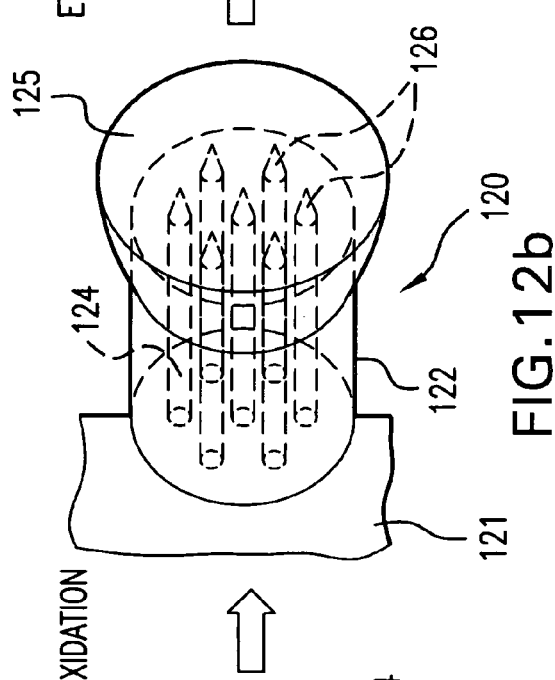
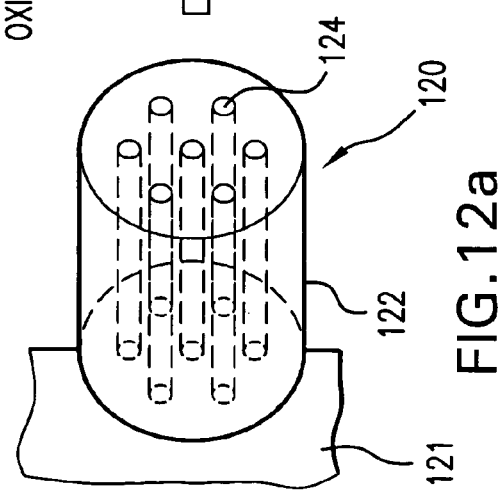

USE OF EXPANDING MATERIAL OXIDES FOR NANO-FABRICATION

BACKGROUND OF THE INVENTION

1. Field of the Invention

This invention relates to a method of fabricating nano-dimensional structures, comprising: depositing at least one deformable material upon a substrate such that the material includes at least one portion; and creating an oxidizable layer located substantially adjacent to the deposited deformable material such that at least a portion of the oxidized portion of the oxidizable layer interacts with the at least one portion of the deformable material to apply a localized pressure upon the at least one portion of the deformable material.

2. Description of the Related Art

Prior to the present invention, as set forth in general terms above and more specifically below, it is known, that industrial interest in materials having structural and functional features with nanoscale dimensions has been growing rapidly. Nano-structures have been fabricated by semiconductor processing techniques including patterning techniques such as photolithography, electron-beam lithography, ion-beam lithography, X-ray lithography, nano-imprint lithography, and the like. Other nano-structures have also been fabricated utilizing structures formed by self-ordering processes.

It is further known that such small objects require novel and specialized methods of fabrication and subsequent processing. One common task is localized encapsulation of conductors or sensing surfaces. With increasing complexity of nanostructures, it will be more and more difficult to insulate certain regions of the device, while leaving others intact or exposed to the environment. At present, the most common and direct approach to encapsulation is to mask the relevant part of the device and cover it with a protective (insulating) layer. However, this general approach is difficult to implement when coverage of the device areas adjacent to the area being insulated is undesirable because it may interfere with the device's operation. In such cases, very precise masking processes (alignment, deposition, etc.) are required, which would be difficult to achieve at the nanoscale level.

As an example, consider the edge of a 100 nm stack of 10 nm thick layers alternating between conducting and insulating layers. Such an edge would be very difficult, if not impossible, to insulate using the traditional mask and deposit approach, Without depositing material on the top face of the structure, which may be undesirable. Such a situation requires a localized means of encapsulation and protection of the conductive edges of the conductive layers. Consequently, a more advantageous nanostructure encapsulation system, then, would be provided if inexpensive and accurate methods of encapsulation could be developed.

With respect to specialized nano-fabrication techniques, the prior art employs a tip of an atomic force microscope to apply a localized pressure at the nanoscale level. While this method can be satisfactory for research purposes, it is not suitable for large-scale fabrication. This is due to the fact that this method is extremely slow and cannot be applied in parallel. Also, the applied force is limited by the mechanical hardness of the tip. Consequently, a further advantageous nano-fabrication technique would be provided if the efficiency of the technique were improved while avoiding the use of the atomic force microscope tip.

It is apparent from the above that there exists a need in the art for a nano-fabrication technique that is inexpensive, effective, and capable of applying a localized pressure. It is a purpose of this invention to fulfill this and other needs in the art in a manner more apparent to the skilled artisan once given the following disclosure.

SUMMARY OF THE INVENTION

Generally speaking, an embodiment of this invention fulfills these needs by providing a method of fabricating nano-dimensional structures, comprising: depositing at least one deformable material upon a substrate such that the material includes at least one portion; and creating an oxidizable layer located substantially adjacent to the deposited deformable material such that at least a portion of the oxidized portion of the oxidizable layer interacts with the at least one portion of the deformable material to apply a localized pressure upon the at least one portion of the deformable material.

In certain preferred embodiments, the deformable material layer can be a non-oxidizable material. Also, the oxidation step can be accomplished through electrochemical oxidation (anodization) or thermal oxidation.

In another further preferred embodiment, the method creates an inexpensive, effective, and localized pressurization of portions of the deformable material.

The preferred method of fabrication of nano-dimensional structures by oxidization, according to various embodiments of the present invention, offers the following advantages: ease-of-use; improved economy; and enabling localized pressurization. In fact, in many of the preferred embodiments, these factors of ease-of-use, improved economy, and localized pressurization are optimized to an extent that is considerably higher than heretofore achieved in prior, known nano-dimensional structure fabrication methods.

The above and other features of the present invention, which will become more apparent as the description proceeds, are best understood by considering the following detailed description in conjunction with the accompanying drawings, wherein like characters represent like parts throughout the several views and in which:

BRIEF DESCRIPTION OF THE DRAWINGS

FIGS. 1a-1c illustrate a method of fabrication of nano-dimensional structures by oxidation, according to one embodiment of the present invention;

FIGS. 7a and 7b are schematic illustrations of a further fabrication technique of nano-dimensional objects, according to another embodiment of the present invention;

FIGS. 9a-9d are schematic illustrations of a further fabrication technique of nano-dimensional objects, according to another embodiment of the present invention;

FIGS. 11a and 11b are schematic illustrations of a further fabrication technique of nano-dimensional objects, according to another embodiment of the present invention; and FIGS. 12a-12c are schematic illustrations of a further fabrication technique of nano-dimensional objects, according to another embodiment of the present invention.

DETAILED DESCRIPTION OF THE INVENTION

Figure 2A:
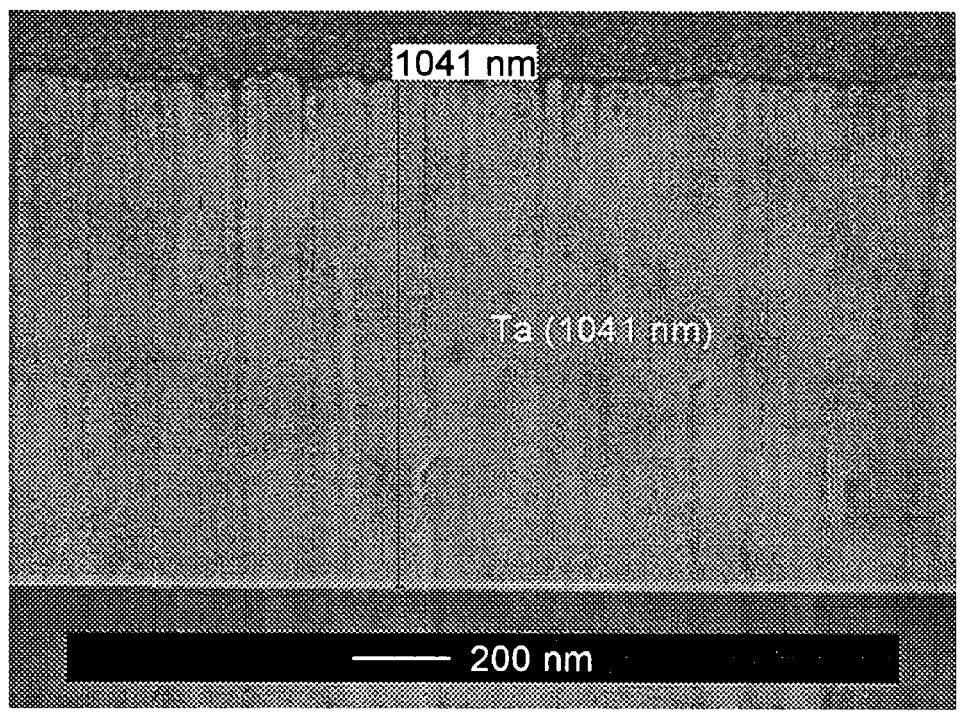
FIG. 2 illustrates the expansion effect of tantalum pentoxide, according to one embodiment of the present invention.

For clarity of the description, the drawings are not drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the invention can be positioned in a number of different orientations, the directional terminology is used for purposes of illustration and is in no way limiting.

The term "oxidation" is used in this specification and the appended claims to mean electrochemical oxidization (anodization) or thermal oxidation of an oxidizable material (such as an oxidizable metal). "Anodization" is performed by employing the oxidizable material as an anode in an electrolytic cell and by operating the electrolytic cell with voltage and current suitable to partially or fully oxidize the material of the anode. An "anodic oxide" is the oxide thus formed. Thermal oxidization refers to a process in which the oxide is formed by exposing the material to a combination of heat and an oxidizing ambient (e.g., oxygen, water vapor, etc). An "oxidizable material" is a material that can be oxidized in these manners. "Partial oxidation" refers to oxidation of less than the entire thickness of a metal layer; i.e., some thickness of unoxidized metal remains after partial oxidation, unless full oxidation is explicitly specified. "Full oxidation" refers to oxidation of the entire thickness of a metal layer. References herein to a layer of oxidizable metal are intended to include semiconductor materials such as silicon which, with respect to their oxidation, behave like the oxidizable metals.

It is to be understood that an oxidizable material may also refer to a material that is oxidized to an oxidation state lower than the maximum oxidation state that may be obtained. For example, in the presence of oxygen, a tantalum oxide film with stoichiometry $Ta_2O$ may be created, for example, via sputter deposition. This tantalum(I) oxide film may then be further oxidized to tantalum(V) oxide, $Ta_2O_5$, with significant further expansion of the oxide film.

An embodiment of a layered structure may be made by providing a substrate, depositing a quantity of electrochemically or thermally oxidizable material such as a metal over the substrate, oxidizing the electrochemically or thermally oxidizable material (partially or fully), and repeating similar steps until a layered structure having a desired total structure thickness is completed. The thickness of each layer of the layered structure may be nanoscopic. Thus, another aspect of the invention provides methods for fabricating embodiments of layered structures, including structures whose layers have nanoscale dimensions.

One embodiment of a method for fabricating a layered structure employs the steps of providing a substrate, depositing a quantity of an electrochemically or thermally oxidizable material over the substrate to form an electrochemically or thermally oxidizable layer, oxidizing the electrochemically or thermally oxidizable material until a layer of oxide is formed, and repeating alternately the depositing and oxidizing steps until a layered structure having a desired total thickness is completed. The structure may be one of the types known as a superlattice. The electrochemically or thermally oxidizable material is oxidized until a layer of oxide having a desired thickness is formed. In some cases, that oxidation may be a partial oxidation, i.e., less than the entire thickness of the oxidizable material is oxidized.

Many electrochemically oxidizable materials are known, including the metals aluminum (Al), tantalum (Ta), niobium (Nb), tungsten (W), bismuth (Bi), antimony (Sb), silver (Ag), cadmium (Cd), iron (Fe), magnesium (Mg), tin (Sn), zinc (Zn), titanium (Ti), copper (Cu), molybdenum (Mo), hafnium (Hf), zirconium (Zr), titanium (Ti), vanadium (V), gold (Au), chromium (Cr), cobalt (Co), iridium (Ir), rhenium (Re), and uranium (U), along with their electrochemically/thermally oxidizable alloys, mixtures, and combinations, all of which are suitable for use in this method. Another suitable material is silicon (Si), although it is not classified as a metal, but as a semiconductor. In short, what is desired in the present invention is that a dense amorphous film be formed during the oxidation process such that the oxidized material is expandable. Thus, references herein to a layer of electrochemically or thermally oxidizable material or metal are intended to include semiconductor materials such as silicon which, with respect to their oxidation, behave like the electrochemically or thermally oxidizable metals. To simplify the description and drawings, embodiments using metals for an electrochemically or thermally oxidizable material will be described. Those skilled in the art will understand that any electrochemically or thermally oxidizable material may be substituted wherever "metal" is mentioned, except where the metal is explicitly described as not being electrochemically or thermally oxidizable. It is to be understood that an oxidizable material may also refer to a material that is not fully oxidized, as discussed above. The thickness of dense oxide films (with densities comparable to theoretical oxide densities) formed by electrochemical oxidation of oxidizable material is precisely controllable by controlling the anodization voltage, as described in more detail hereinbelow.

Figure 2B:
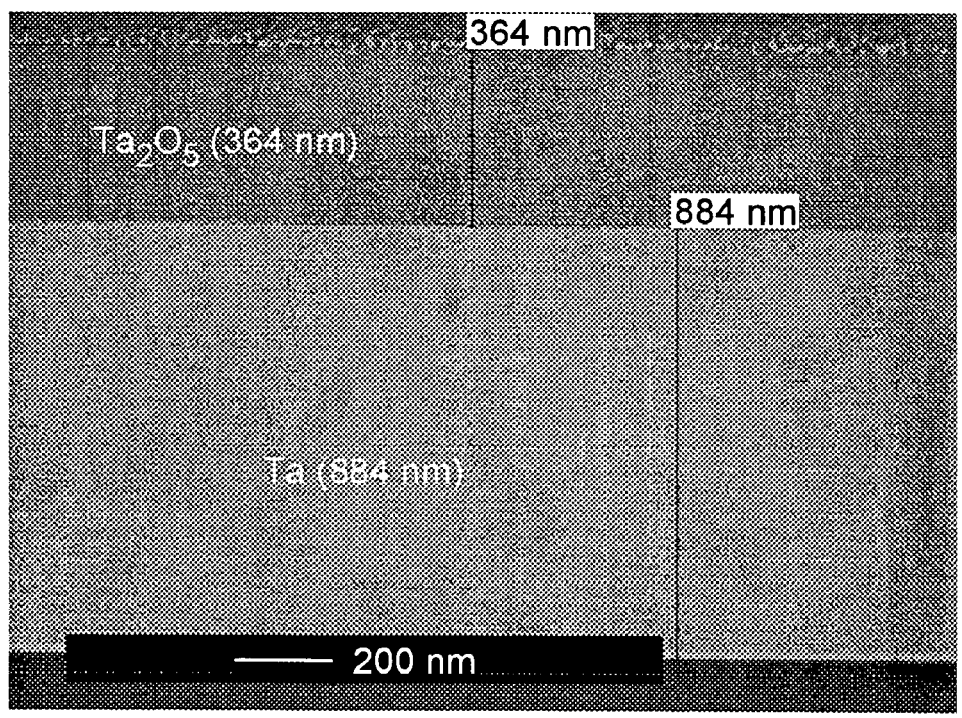

Returning now to the description of a method embodiment for fabricating a layered structure, the layer of electrochemically or thermally oxidizable metal (or, in the case of silicon, for example, electrochemically oxidizable semiconductor) may be deposited by any suitable conventional deposition method, such as evaporation, sputtering, plating, electroplating, atomic layer deposition (ALD), or chemical vapor deposition (CVD) and other known types of vapor deposition techniques. The metal layer may have a thickness of about two nanometers (2 nm) or greater, for example, with essentially no theoretical upper limit, but limited only by practical considerations such as deposition conditions, application requirements, stresses, etc With reference first to FIG. 1, there is illustrated one preferred embodiment for use of the concepts of this invention. As shown in FIG. 1a, a schematic illustration of a nano-dimensional structure 10 is presented. A suitable substrate 12 is provided. For many applications, substrate 12 is a smooth planar silicon wafer as is commonly used in semiconductor manufacturing. For some applications, a layer of insulating material such as silicon oxide or silicon nitride may be formed on the silicon wafer so the top surface of the substrate is an insulator. It is to be understood that the substrate can also be constructed of glass; quartz; alumina; stainless steel; various plastics; and mixtures and combinations thereof. See, for example, commonly assigned, pending U.S. patent application Ser. No. 10/062,050, filed Jan. 31, 2005, entitled "Periodic Layered Structures and Methods Therefore" and Ser. No. 10/??????, filed ????, 2005, entitled "Encapsulation of Nano-Dimensional Structures by Oxidation", which are to be incorporated by reference in their entirety. An oxide layer 16 is initially deposited upon substrate 12. A layer 14 of a first metal is conventionally deposited upon oxide layer 16. In this embodiment, the first metal is an electrochemically oxidizable material. When the metal layer 14 is partially oxidized to create an oxide layer 16, the total thickness typically increases. The volume ratio of oxide to consumed metal is typically greater than one. For example, partial oxidization of a 1041 nanometer film of tantalum results in a tantalum oxide film having a thickness of 364 nanometers and an overall thickness of 1,248 nanometers. (See, for example, FIG. 2). Another layer 14 of the first metal is deposited upon oxide layer 16 and further partially oxidized to create another oxide layer 16. The process of depositing the metal layer 14 and partially oxidizing it to create oxide layer 16 is performed until the desired layering effect is achieved.

After nano-dimensional structure 10 has been constructed, one or more metal layers 14 are further partially oxidized, as shown in FIG. 1b. This further partial oxidization causes the oxide layer 16 to expand around metal layer 14. As a by-product of this expansion, nodes 18 in the oxide layer 16 are formed that also extend from the exposed portion of metal layer 14. This further expansion of the oxide layer 16 provides a complete encapsulation 19 around a portion of the entire structure 10, as shown in FIG. 1c.

As discussed earlier, FIG. 2 shows the expansion effect of tantalum pentoxide ($Ta_2O_5$) as the result of the process of electrochemical oxidation of tantalum (Ta). The expansion coefficient is defined as the ratio of produced $Ta_2O_5$ volume to consumed Ta volume. In this embodiment, the expansion coefficient is approximately 2.3 for oxidation of Ta.

Figure 3A:
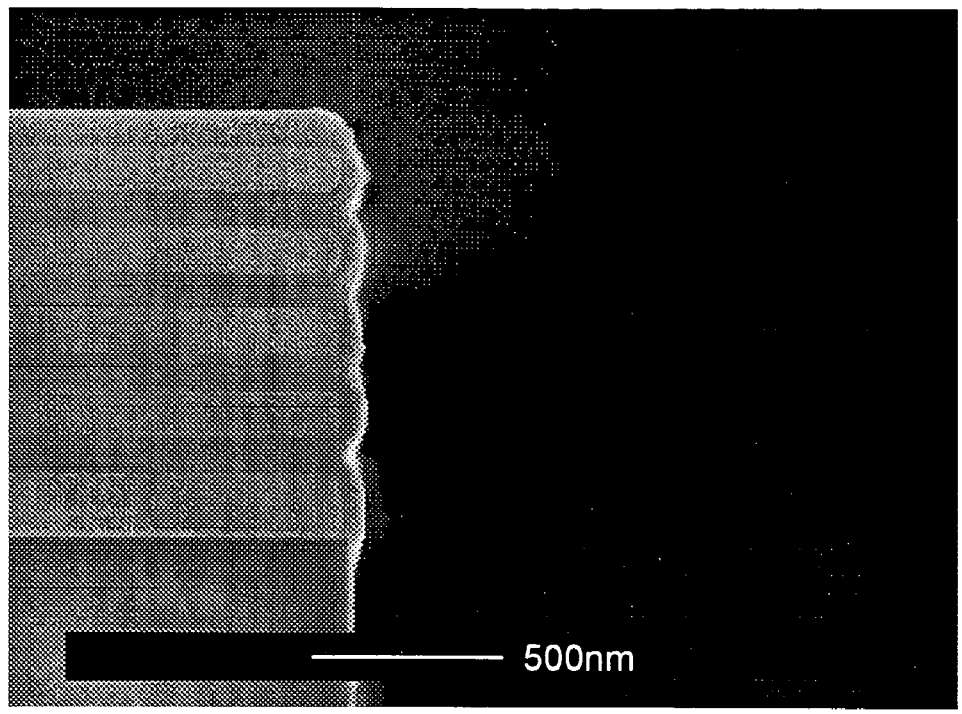
FIGS. 3a and 3b illustrate a tantalum/tantalum pentoxide stack oxidized from the edge, according to another embodiment of the present invention.
Figure 3B:
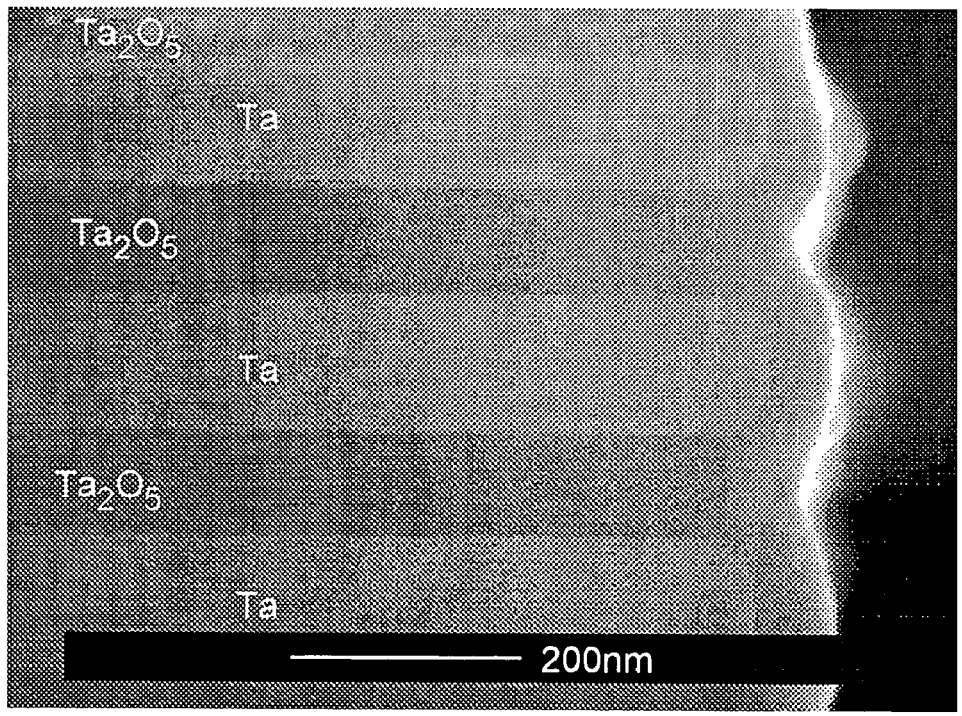

With respect to FIGS. 3a and 3b, encapsulation of 100 nm tantalum (Ta) layers is presented. Scanning electron microscope (SEM) images of a $Ta/Ta_2O_5$ stack partially oxidized from the edge to an oxide thickness of approximately 50 nm is shown. It must be pointed out that the external oxide profile substantially conforms to the profile of the Ta layers. This relatively small oxidation thickness corresponds to FIG. 1b.

Figure 4A:
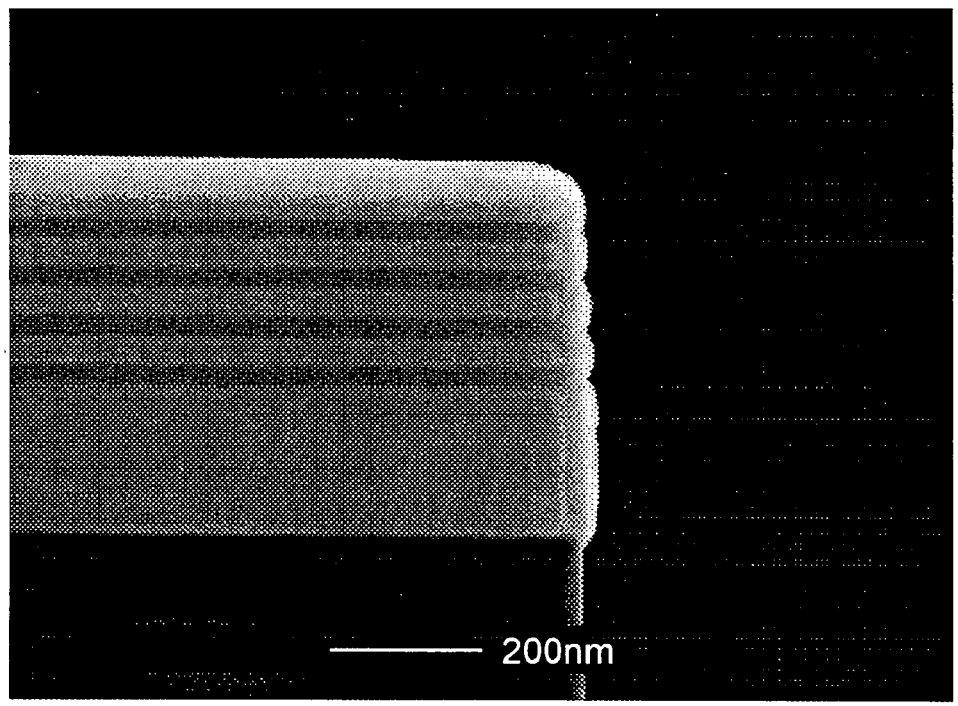
FIGS. 4a and 4b illustrate another tantalum/tantalum pentoxide stack oxidized from the edge, according to another embodiment of the present invention.
Figure 4B:
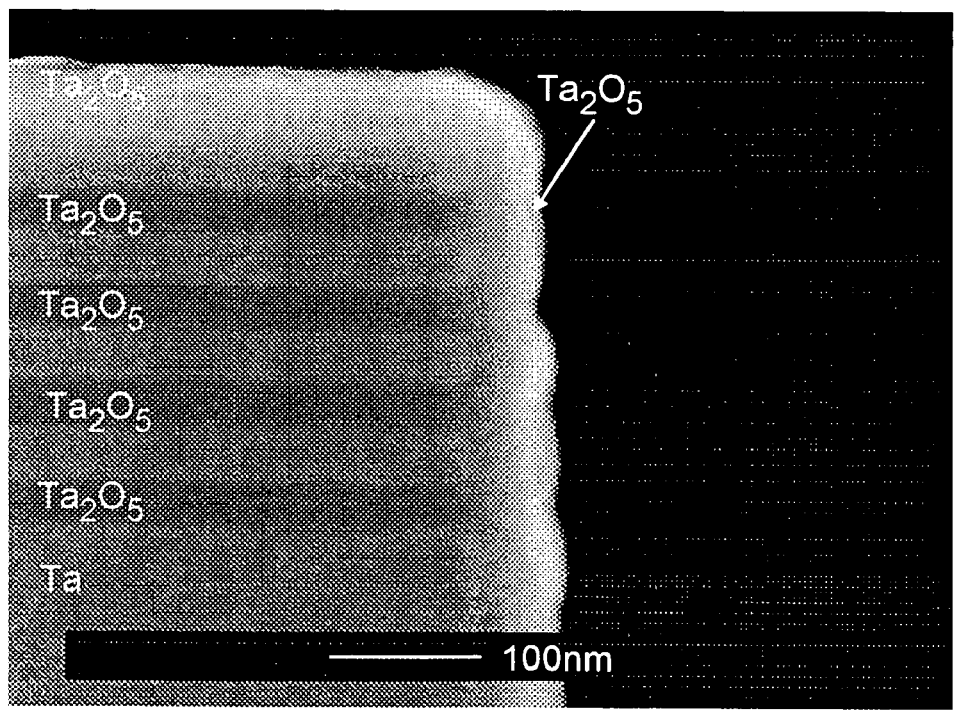

With respect to FIGS. 4a and 4b, encapsulation of 30 nm tantalum (Ta) layers is presented. SEM images of a $Ta/Ta_2O_5$ stack partially oxidized from the edge to a specific thickness of approximately 30 nm of $Ta_2O_5$ are shown. As further partial oxidization of the Ta layers is completed, the external oxide profile begins to conform less and less to the profile of the Ta layers.

Figure 5A:
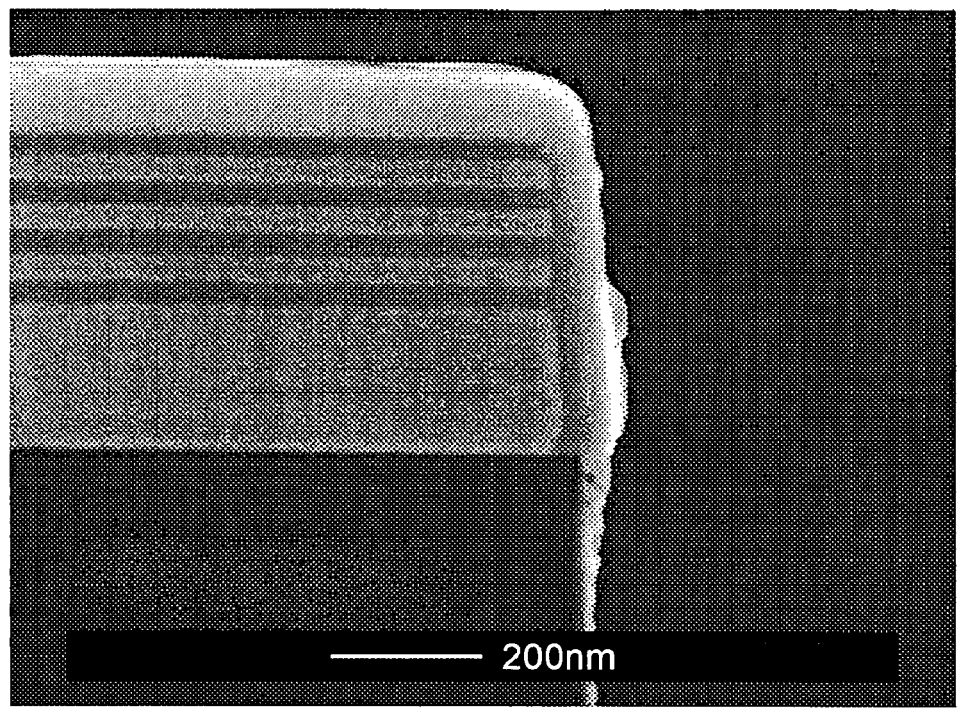
FIGS. 5a and 5b illustrate still another tantalum/tantalum pentoxide stack oxidized from the edge, according to another embodiment of the present invention.
Figure 5B:
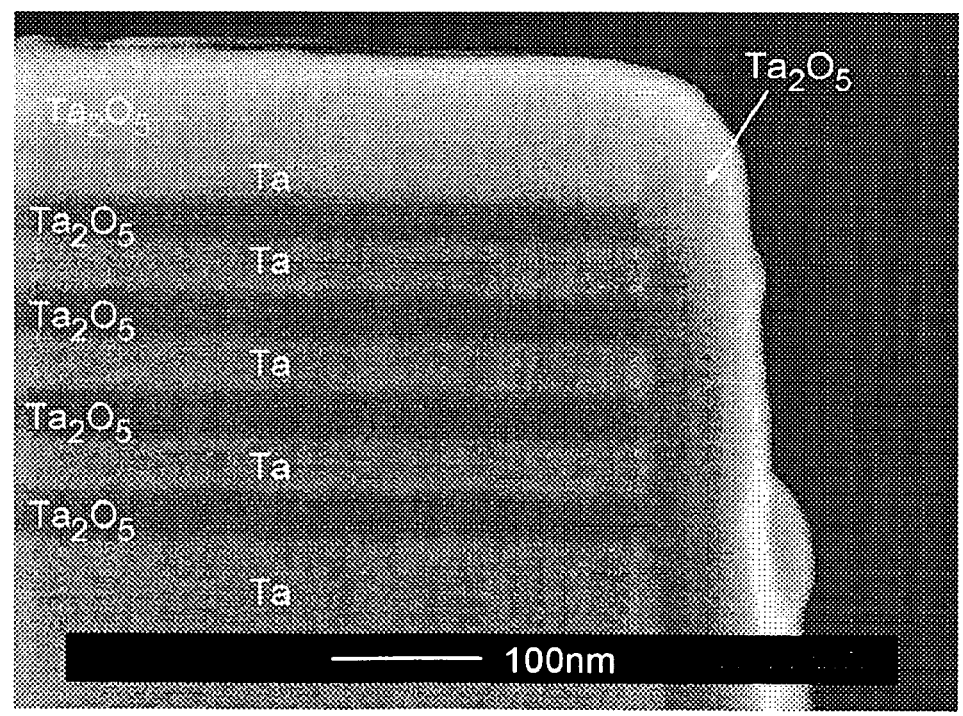

With respect to FIGS. 5a and 5b, further partial oxidization (60 nm thickness of $Ta_2O_5$) of the Ta layers results in a continuous, dense, smooth, expandable oxidation layer without evidence of the underlying metal layer structure. At this point, effective encapsulation of the underlying nano-dimensional structure has been achieved.

Figure 6B:
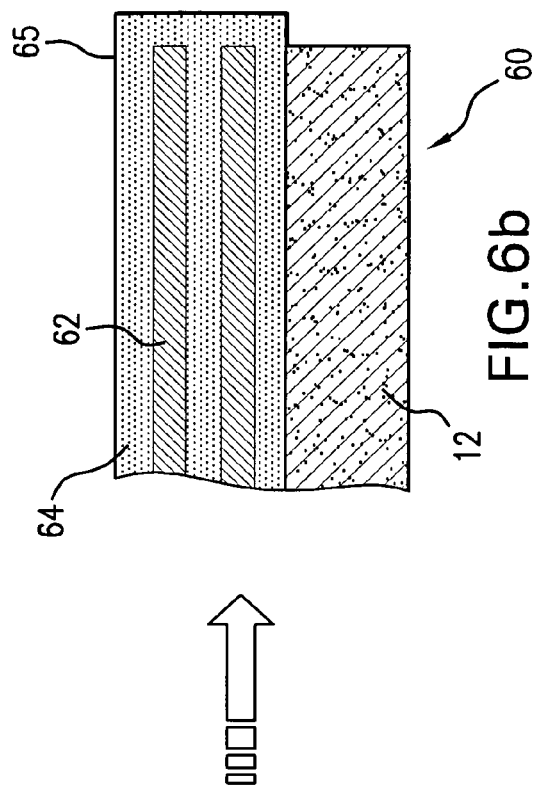
FIGS. 6a-6d are schematic illustrations of oxidation of a metal, according to another embodiment of the present invention.
Figure 6D:
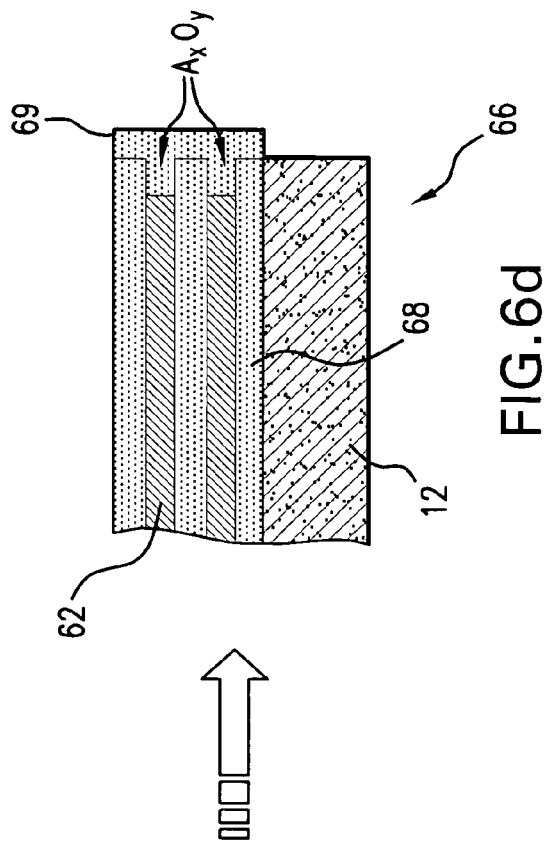
Figure 6A:
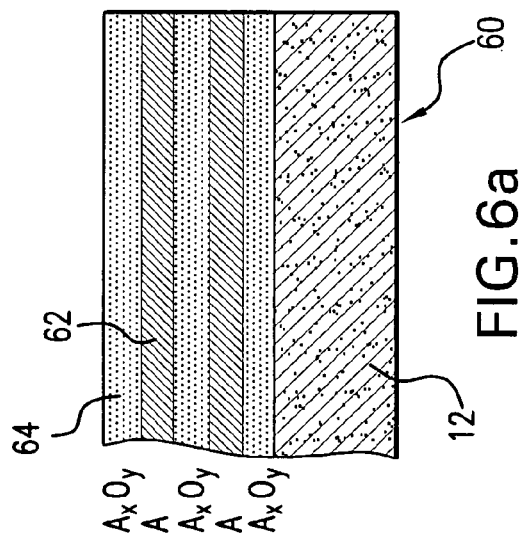

With respect to FIGS. 6a-6d, nano-dimensional structure 60 is illustrated. In FIGS. 6a and 6b, oxide layer 64 is deposited upon substrate 12. Metal layers 62 are then partially oxidized to create oxide layers 64, 68 in a similar fashion, as discussed above. As can be seen in FIG. 6b, encapsulation layer 65 provides a complete encapsulation around metal layers 62. In FIGS. 6a and 6b, oxide layers 64 are metal oxides of metal layers 62.

Figure 6C:
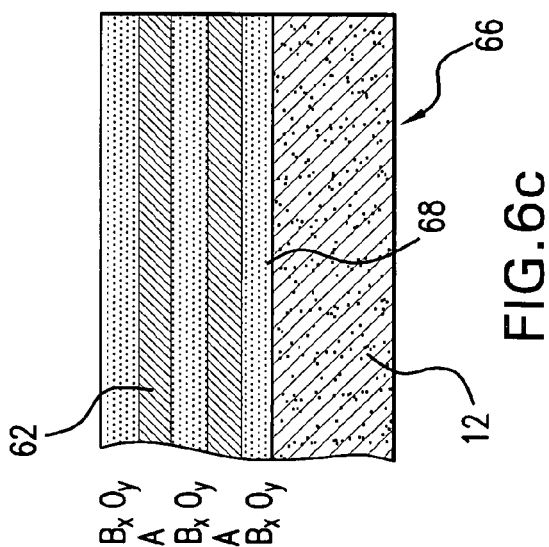

With respect to FIGS. 6c and 6d, oxide layers 68 are formed by directly depositing the appropriate material 68, or perhaps by depositing a 2-layer metal stack and then oxidizing only the "top" sub-layer of metal corresponding to the oxide type 68, leaving the remaining metal layer 62 unoxidized. As can be seen in these figures, a metal oxide is formed from a metal that is different than the metal in layer 62. As can be further seen in FIG. 6d, oxide layer 69 provides a complete encapsulation around metal layers 62 and material layers 68. This fabrication technique of utilizing a metal oxide that is formed from a metal that is different than the metal in a layer 62 will be further explored, as set forth below.

With respect to FIGS. 7a and 7b, it has also been discovered that the nano-fabrication techniques shown in FIGS. 6a-6d can create a mechanical pressure that is generated during the oxidation process which manifests itself in the geometries where a region of a relatively soft or deformable material 76 is adjacent to a region of an oxidizable material 74. More particularly, a non-oxidizable substrate 72 is covered with a multilayer stack of oxidizable materials 74 and deformable materials 76 which make up nano-dimensional structure 70. In the simplest case, the stack consists of one deformable layer 76 on top of one oxidizable layer 74 (FIG. 7a). It is to be understood that the stack may be patterned by conventional lithographic or other techniques. As shown in FIG. 7b, an oxidation step is performed which creates an expandable oxide layer 75 that causes the deformable layer 76 to bend or deform upwards at points 78. As a result, the shape of the deformable layer 76 will be altered. In this case, the original planar film stack is modified to yield partially vertically oriented edges with an edge "sharpness" defined by the thickness of the original film, which can be quite small. The non-oxidizable, deformable layer 76 can be constructed of, but is not limited to, platinum (Pt), aluminum oxide ($Al_2O_3$), zinc oxide (ZnO), indium tin oxide (ITO), $SnO_2$ or the like. It is to be understood that after the deformable layer 76 has been deformed, the oxide layer 75 can be conventionally, selectively removed in order to leave the "free-standing" portion of deformable layer 76 in the resulting deformed position.

An advantage of this nano-fabrication process is that employs conventional processing of films within the plane of the substrate, after which the final oxidation step acts to provide a change in local orientation by "deforming" selected edges upward toward a vertical orientation. Since conventional processing methods can be used until this final step, this embodiment is amenable to integration with, for example, underlying circuitry, thus enabling the fabrication of electronically controlled arrays of the structures, as described below. Also, the present invention can be employed on multiple layered structures to achieve a variety of effects. It is to be understood that the degree of deformation in the drawings is for illustrative purposes only and not drawn to scale. It is to be further understood that the oxidizable material may be selectively oxidized to provide a non-uniform pressure upon the deformable material. Finally it is to be understood that the layers of deformable materials can be not only deformed out but deformed towards each other so that they contact each other in a controllable fashion.

With respect to FIGS. 8a-8f, a further embodiment of the concepts described in FIG. 7 is provided. As shown in FIG.

8a, nano-dimensional structure 80 includes, in part, substrate 82, oxidizable material 84, deformable layer 86, and upper layer 88. Preferably, upper layer 88 is constructed of any suitable material that has sufficient mechanical rigidity to partially constrain the expansion of the oxidizable material 84 and the deformation of the deformable layer 86. Also, upper layer 88 may be patterned with an edge 83 "pulled back" relative to the end of the oxidizable and deformable layers, so as to provide a sharper radius of curvature 87 as the deformable layer 86 is "deformed" upward by the expanding oxide layer 85 (FIG. 8b). FIG. 8c illustrates an isometric view of FIG. 8b.

Figure 8A:
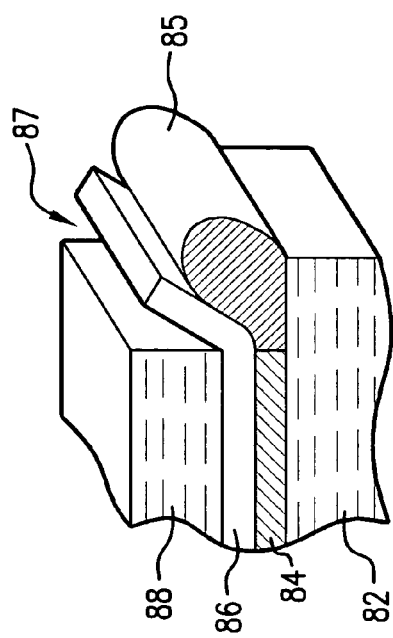
FIGS. 8a-8f are schematic illustrations of a further fabrication technique of nano-dimensional objects, according to another embodiment of the present invention.
Figure 8B:
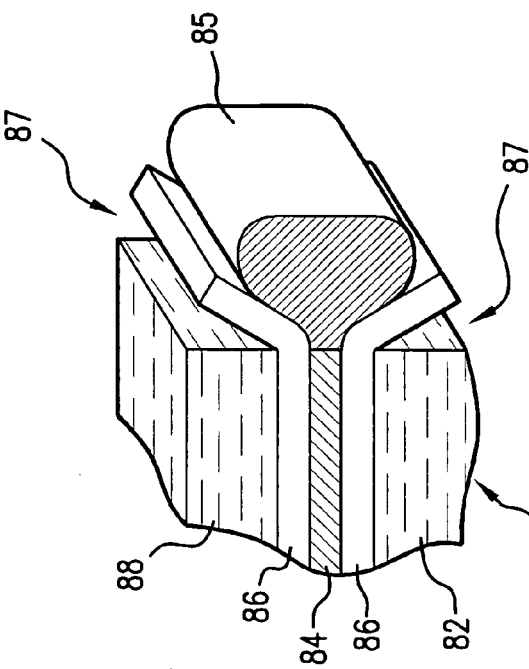
Figure 8C:
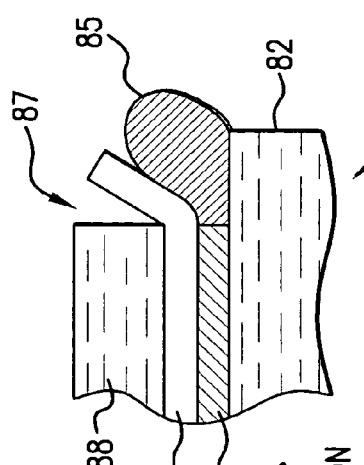
Figure 8D:
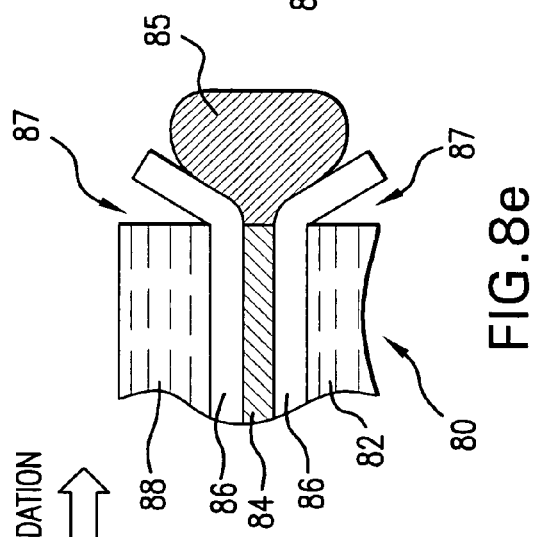
Figure 8E:
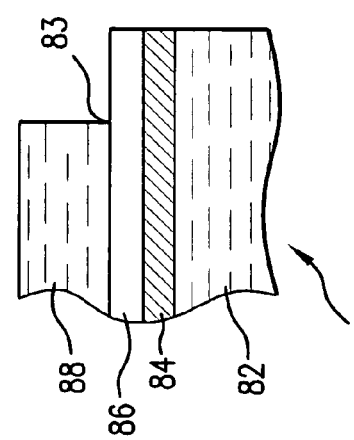
Figure 8F:
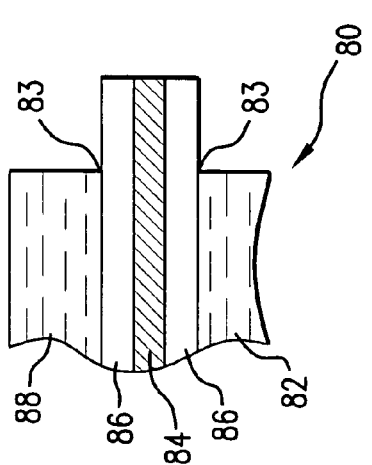

With respect to FIGS. 8d-8f, a further embodiment of the concepts described in FIGS. 8a-8c is provided. As shown in FIG. 8c, nano-dimensional structure 80 includes, in part, lower layer 82, edges 83, oxidizable material 84, deformable layers 86, and upper layer 88. As shown in FIG. 8e, when oxide layer 85 expands this expansion causes deformable layers 86 to "deform" in opposite directions along radii of curvature 87. FIG. 8f illustrates an isometric view of FIG. 8e. It is to be understood that after the deformable layers 86 have been "deformed", the oxide layer 85 can be conventionally, selectively removed in order to leave the "free-standing" portions of deformable layers 86 in the resulting deformed position.

With respect to FIGS. 9a-9d, a further embodiment of the concepts described in FIG. 7 is provided. As shown in FIG. 9a, nano-dimensional structure 90 includes, in part, substrate 92, oxidizable material 94, and deformable material 96. As shown in FIG. 9b, when expandable oxide layer 95 is formed, the resulting pressure exerts uniform pressure (normal to the plane of the films) on the deformable layers 96. This pressure causes an extrusion of the deformable material layers 96 outward from the exposed edge and effectively "sharpens" these edges. The oxide layer 95 may optionally then be conventionally removed to expose the sharpened edges 97 (FIG. 9c). FIG. 9d illustrates an isometric view of FIG. 9c.

Figure 10:
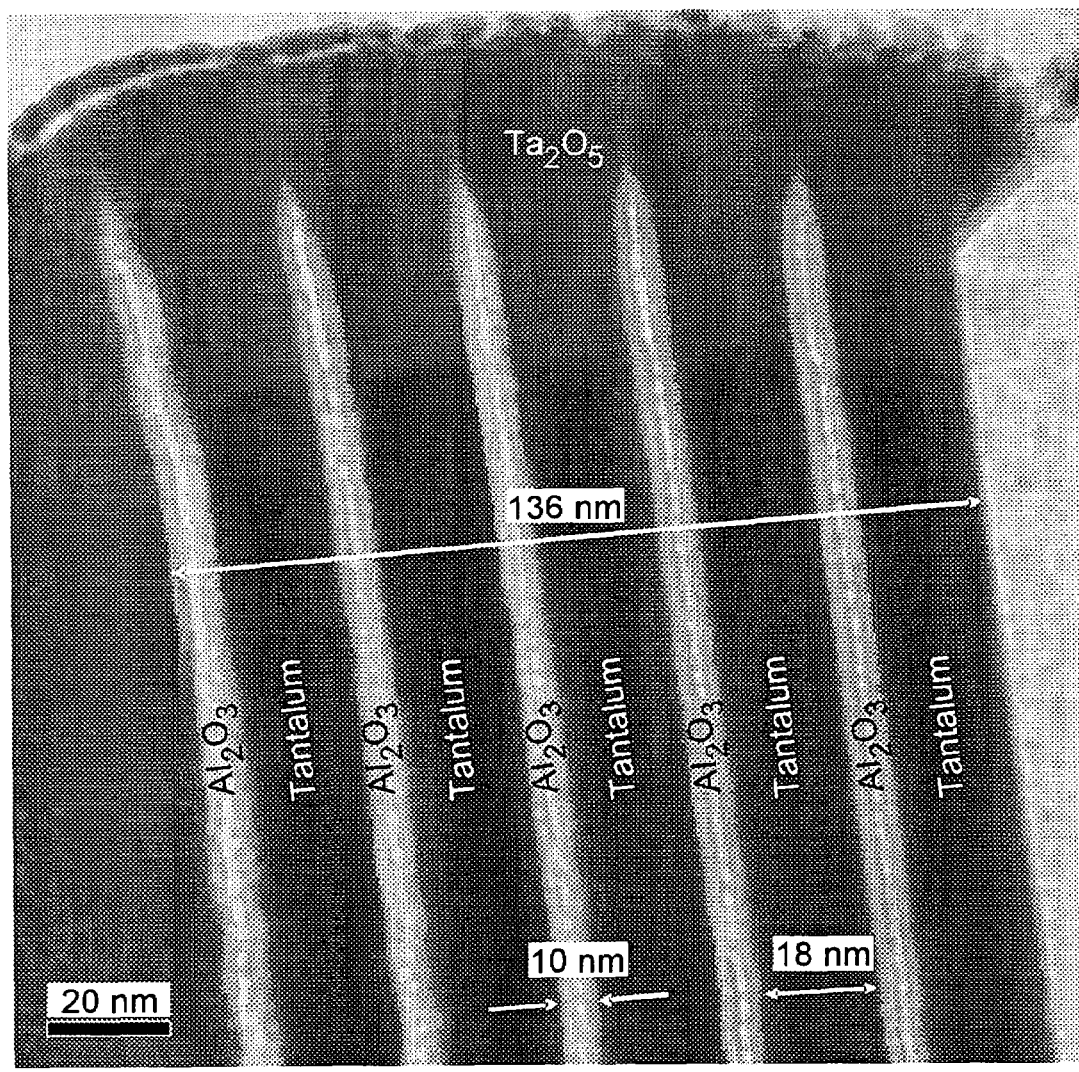
FIG. 10 is a transmission electron microscope (TEM) image of the fabrication technique of nano-dimensional objects of FIGS. 9a-9d, according to another embodiment of the present invention.

FIG. 10 is a transmission electron microscope (TEM) cross-sectional image of a Ta/Al$_2$O$_3$ multilayer stack in which the edges of the Al$_2$O$_3$ layers are "sharpened" by anodization of the Ta layers from the edge.

With respect to FIGS. 11a and 11b, nano-dimensional structure 110 includes, in part, substrate 112, deformable material 114, and oxidizable material 116. As can be seen in FIG. 11a, deformable material 114 can be shaped into multiple parallel "wires". As shown in FIG. 11b, when expandable oxide layer 115 is formed, the resulting pressure exerts uniform pressure on the deformable material 114. This pressure causes the deformable material or "wires" 114 to bend radially outward. It is to be understood that after the deformable layer 114 has been "deformed", the oxide layer 115 can be conventionally, selectively removed in order to leave the "free-standing" deformable layer 114 in the resulting deformed position.

With respect to FIGS. 12a-12c, nano-dimensional structure 120 includes, in part, substrate 121, oxidizable material 122, and deformable material or "wires" 124. As can be seen in FIG. 12b, when expandable oxide layer 125 is formed, the resulting pressure exerts uniform pressure around the circumference of the deformable material or "wires" 124. This pressure causes an extrusion of the deformable material 124 outward from the exposed edge and effectively "sharpens" these wires by creating a reduction in tip dimension. The oxide layer 125 may then be conventionally removed to expose the sharpened tips 126 (FIG. 12c.

Also, the present invention can be embodied in any computer-readable medium for use by or in connection with an instruction-execution system, apparatus or device such as a computer/processor based system, processor-containing system or other system that can fetch the instructions from the instruction-execution system, apparatus or device, and execute the instructions contained therein. In the context of this disclosure, a "computer-readable medium" can be any means that can store, communicate, propagate or transport a program for use by or in connection with the instruction-execution system, apparatus or device. The computer-readable medium can comprise any one of many physical media such as, for example, electronic, magnetic, optical, electromagnetic, infrared, or semiconductor media. More specific examples of a suitable computer-readable medium would include, but are not limited to, a portable magnetic computer diskette such as floppy diskettes or hard drives, a random access memory (RAM), a read-only memory (ROM), an erasable programmable read-only memory, or a portable compact disc. It is to be understood that the computer-readable medium could even be paper or another suitable medium upon which the program is printed, as the program can be electronically captured, via, for instance, optical scanning of the paper or other medium, then compiled, interpreted or otherwise processed in a single manner, if necessary, and then stored in a computer memory.

Those skilled in the art will understand that various embodiment of the present invention can be implemented in hardware, software, firmware or combinations thereof. Separate embodiments of the present invention can be implemented using a combination of hardware and software or firmware that is stored in memory and executed by a suitable instruction-execution system. If implemented solely in hardware, as in an alternative embodiment, the present invention can be separately implemented with any or a combination of technologies which are well known in the art (for example, discrete-logic circuits, application-specific integrated circuits (ASICs), programmable-gate arrays (PGAs), field-programmable gate arrays (FPGAs), and/or other later developed technologies. In preferred embodiments, the present invention can be implemented in a combination of software and data executed and stored under the control of a computing device.

It will be well understood by one having ordinary skill in the art, after having become familiar with the teachings of the present invention, that software applications may be written in a number of programming languages now known or later developed.

Once given the above disclosure, many other features, modifications or improvements will become apparent to the skilled artisan. Such features, modifications or improvements are, therefore, considered to be a part of this invention, the scope of which is to be determined by the following claims.

What is claimed is:

1. A method of fabricating nano-dimensional structures, comprising:
   depositing at least one deformable material upon a substrate such that the deformable material includes at least one portion; and
   creating an oxidizable layer located substantially adjacent to the deposited deformable material such that at least a portion of the oxidizable layer is configured to expand and interact with the at least one portion of the deformable material in response to an oxidation process to apply a localized pressure upon the at least one portion of the deformable material which results in a physical deformation of the at least one portion or the deformable material.

2. The method, as in claim 1, wherein the deformable material comprises a material selected from the list consisting of: platinum (Pt), aluminum oxide ($Al_2O_3$), zinc oxide (ZnO), indium tin oxide (ITO), $SnO_2$, mixtures, and combinations thereof.

3. The method, as in claim 1, wherein the substrate comprises a material selected from the list consisting of: glass; quartz; alumina; stainless steel; silicon along with its oxides, nitrides; various plastics; mixtures, and combinations thereof.

4. The method, as in claim 1, wherein the oxidized layer comprises an oxide of a material selected from the list consisting of: aluminum (Al), tantalum (Ta), niobium (Nb), tungsten (W), bismuth (Bi), antimony (Sb), silver (Ag), cadmium (Cd), iron (Fe), magnesium (Mg), tin (Sn), zinc (Zn), titanium (Ti), copper (Cu), molybdenum (Mo), hafnium (Hf), zirconium (Zr), titanium (Ti), vanadium (V), gold (Au), cobalt (Co), iridium (Ir), rhenium (Re), uranium (U), chromium (Cr), and combinations thereof.

5. The method, as in claim 1, wherein the oxidized layer is created by electrochemical oxidation.

6. The method, as in claim 1, wherein the oxidized layer is created by thermal oxidation.

7. The method, as in claim 1, wherein the creating step is further comprised of the step of:
deforming the at least one portion of the deformable material by initiating the oxidation process to cause the at least a portion of the oxidizable layer to expand.

8. The method, as in claim 1, wherein the creating step is further comprised of the step of:
extruding the at least one portion of the deformable material to create an edge.

9. The method, as in claim 1, wherein the creating step is further comprised of the step of:
extruding the at least one portion of the deformable material to create a tip.

10. A program storage medium readable by computer, tangibly embodying a program of instructions executable by the computer to perform method steps for a method of fabricating nano-dimensional structures, comprising:
depositing at least one deformable material upon a substrate such that the deformable material includes at least one portion; and
creating an oxidizable layer located substantially adjacent to the deposited deformable material such that at least a portion of the oxidizable layer is configured to expand and interact with the at least one portion of the deformable material in response to an oxidation process to apply a localized pressure upon the at least one portion of the deformable material which results in a physical deformation of the at least one portion of the deformable material.

11. The method, as in claim 10, wherein the deformable material comprises a material selected from the list consisting of: platinum (Pt), aluminum oxide ($Al_2O_3$), zinc oxide (ZnO), indium tin oxide (ITO), $SnO_2$, along with their oxidizable alloys, mixtures, and combinations thereof.

12. The method, as in claim 10, wherein the creating step is further comprised of the step of:
deforming the at least one portion of the deformable material by initiating the oxidation process to cause the at least a portion of the oxidizable layer to expand.

13. The method, as in claim 10, wherein the creating step is further comprised of the step of:
extruding the at least one portion of the deformable material to create an edge.

14. The method, as in claim 10, wherein the creating step is further comprised of the step of:
extruding the at least one portion of the deformable material to create a tip.

* * * * *